(12) United States Patent
Zhang et al.

(10) Patent No.: US 12,230,637 B2
(45) Date of Patent: Feb. 18, 2025

(54) ARRAY SUBSTRATE, MANUFACTURING METHOD THEREOF, AND DISPLAY PANEL

(71) Applicant: Shenzhen China Star Optoelectronics Semiconductor Display Technology Co., Ltd., Guangdong (CN)

(72) Inventors: Yu Zhang, Guangdong (CN); Miao Jiang, Guangdong (CN); Jiangbo Yao, Guangdong (CN); Lixuan Chen, Guangdong (CN); Xin Zhang, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/054,542

(22) PCT Filed: Nov. 9, 2020

(86) PCT No.: PCT/CN2020/127516
§ 371 (c)(1),
(2) Date: Nov. 11, 2020

(87) PCT Pub. No.: WO2022/057059
PCT Pub. Date: Mar. 24, 2022

(65) Prior Publication Data
US 2024/0290793 A1    Aug. 29, 2024

(30) Foreign Application Priority Data
Sep. 17, 2020   (CN) .......................... 202010981282.3

(51) Int. Cl.
*H01L 27/12* (2006.01)

(52) U.S. Cl.
CPC ........ H01L 27/1222 (2013.01); H01L 27/127 (2013.01); H01L 27/1292 (2013.01)

(58) Field of Classification Search
CPC ............. H01L 27/1222; H01L 27/1225; H01L 27/1229
See application file for complete search history.

(56) References Cited

U.S. PATENT DOCUMENTS

2019/0081191 A1    3/2019  Manda

FOREIGN PATENT DOCUMENTS

| CN | 108475643 | 8/2018 |
|---|---|---|
| CN | 110105953 | 8/2019 |
| CN | 110197876 | 9/2019 |
| CN | 110364625 | 10/2019 |

(Continued)

OTHER PUBLICATIONS

Li et al., "Inkjet Printing of MoS2," Advanced Functional Materials, vol. 24, pp. 6524-6531. (Year: 2014).*

(Continued)

*Primary Examiner* — Peter M Albrecht

(57) ABSTRACT

An array substrate, a manufacturing method thereof, and a display panel are provided. The present invention uses an inkjet printing method to construct a two-dimensional nanomaterial as a photosensitive film, and adjusts a composition of the nanomaterial to construct a photoelectric film with high gain, which is then combined with a high mobility film to construct a display device with high mobility and broad spectrum light response.

7 Claims, 5 Drawing Sheets

(56) References Cited

FOREIGN PATENT DOCUMENTS

| | | | | |
|---|---|---|---|---|
| CN | 110379924 | | 10/2019 | |
| CN | 110797410 A | * | 2/2020 | ......... H01L 27/1222 |
| CN | 110993721 A | | 4/2020 | |
| CN | 111524915 | | 8/2020 | |
| JP | 2008-204757 | | 9/2008 | |

OTHER PUBLICATIONS

Zhu et al., "Thin film transistors based on two dimensional graphene and graphene/semiconductor heterojunctions," RSC Advances, vol. 7, pp. 17387-17397. (Year: 2017).*

International Search Report and the Written Opinion Dated Jun. 16, 2021 From the International Searching Authority Re. Application No. PCT/CN2020/127516 and Its Translation Into English. (13 Pages).

Notification of Office Action and Search Report Dated Jul. 15, 2022 From the State Intellectual Property Office of the People's Republic of China Re. Application No. No. 202010981282.3 and Its Translation Into English. (15 Pages).

Notification of Office Action and Search Report Dated Apr. 28, 2023 From the State Intellectual Property Office of the People's Republic of China Re. Application No. No. 202010981282.3 and Its Translation Into English. (15 Pages).

* cited by examiner

ARRAY SUBSTRATE, MANUFACTURING METHOD THEREOF, AND DISPLAY PANEL

RELATED APPLICATIONS

This application is a National Phase of PCT Patent Application No. PCT/CN2020/127516 having International filing date of Nov. 9, 2020, which claims the benefit of priority of Chinese Patent Application No. 202010981282.3 filed on Sep. 17, 2020. The contents of the above applications are all incorporated by reference as if fully set forth herein in their entirety.

FIELD AND BACKGROUND OF THE INVENTION

The present invention relates to the field of display technologies, and in particular, to an array substrate, a manufacturing method thereof, and a display panel.

As 5G era approaches, human-computer interactions continue to escalate and develop. Simple proximity touch can no longer satisfy user experience. In an implementation of remote interaction, currently the hottest development is an optical interaction. At present, the industry mostly adopts complementary metal oxide semiconductor (CMOS) or cameras to capture light from gestures to achieve interactions. However, camera captures require a separate module, which will reduce a penetration rate of a screen display, and its design requires special design, which is contrary to a concept of full screen. Therefore, integrating photo-responsive circuits between display circuits can greatly reduce costs and improve aesthetic design.

Currently, most photo-responsive devices are integrated into the display circuits using amorphous silicon (a-Si) technologies. This is because a-Si is an excellent light-responsive material, and a light-response wavelength band is in a visible light region. However, an electron mobility of a-Si is inferior to that of indium gallium zinc oxide (IGZO). Therefore, development of IGZO devices with light response function is an iterative product that can further improve signal transmission. However, a light absorption band of IGZO devices is stronger in an ultraviolet band, and ultraviolet is more harmful to the human body and is not suitable for use in human-computer interaction scenarios. Therefore, it is very necessary to develop the IGZO devices with optical spectrum absorption.

A light absorption band of IGZO devices is stronger in an ultraviolet band, and ultraviolet is more harmful to the human body and cannot be used.

SUMMARY OF THE INVENTION

The present invention provides a method of manufacturing an array substrate, comprising following steps: providing a base substrate; forming a first metal layer on the base substrate; forming a gate insulating layer on the first metal layer; forming an active layer on the gate insulating layer; and forming a second metal layer on the active layer, wherein the active layer comprises a first device layer and a second device layer stacked in sequence, a material of the second device layer is a two-dimensional nanomaterial, and the second device layer has broad spectrum sensitivity.

Further, the step of forming the active layer on the gate insulating layer further comprises: forming the first device layer on the gate insulating layer, wherein a mobility of the first device layer is greater than a preset mobility, and the preset mobility ranges from 50 to 300 $cm^2V^{-1}S^{-1}$; and depositing ink on the first device layer by inkjet printing to form the second device layer.

Further, a solute of the ink is PEAI:MAI:PbI2=2:2:3, and a solvent of the ink is N,N-DMF.

Further, after the step of depositing the ink on the first device layer by inkjet printing to form the second device layer, further comprising: heating the ink to a temperature of 40° C. to 60° C. until a solvent evaporates.

Further, the two-dimensional nanomaterial comprises two-dimensional perovskite, two-dimensional molybdenum sulfide, a two-dimensional inorganic compound, or combinations thereof.

According to another aspect of the present invention, further provides an array substrate comprising a base substrate; a first metal layer disposed on the base substrate; a gate insulating layer disposed on the first metal layer; an active layer disposed on the gate insulating layer; and a second metal layer disposed on the active layer; wherein the active layer comprises a first device layer and a second device layer stacked in sequence, a material of the second device layer is a two-dimensional nanomaterial, and the second device layer has broad spectrum sensitivity.

Further, the first device layer is disposed on the gate insulating layer, a mobility of the first device layer is greater than a preset mobility, and the preset mobility ranges from 50 to 300 $cm^2V^{-1}S^{-1}$.

Further, a precursor of the material of the second device layer comprises PEAI, MAI, and PbI2, and a ratio of PEAI, MAI, and PbI2 is 2:2:3.

Further, the two-dimensional nanomaterial comprises two-dimensional perovskite, two-dimensional molybdenum sulfide, a two-dimensional inorganic compound, or combinations thereof.

According to another aspect of the present invention, further provides a display panel comprising the above-mentioned array substrate.

Beneficial Effect

Advantages of the present invention are that compared with the prior art, the present invention uses an inkjet printing method to construct a two-dimensional nanomaterial as a photosensitive film, and adjusts a composition of a nanomaterial to construct a photoelectric film with high gain, which is then combined with a high mobility film to construct a display device with high mobility and broad spectrum light response.

BRIEF DESCRIPTION OF THE SEVERAL VIEWS OF THE DRAWINGS

In order to more clearly describe the technical solutions in the embodiments of the present invention, a brief introduction of the drawings used in embodiment description will be briefly described below. Obviously, the drawings in the following description are only some of the embodiments of the present invention, and those skilled in the art can obtain other drawings according to the drawings without any creative work.

DESCRIPTION OF SPECIFIC EMBODIMENTS OF THE INVENTION

The technical solution in the embodiments of the present invention will be clearly and completely described below with reference to the accompanying drawings in the embodiments of the present invention. It is to be understood that the described embodiments are merely exemplary of the invention, and not restrictive of the full scope of the invention. All other embodiments, which can be obtained by a person skilled in the art without inventive step based on the embodiments of the present invention, are within the scope of the present invention.

Figure 1:
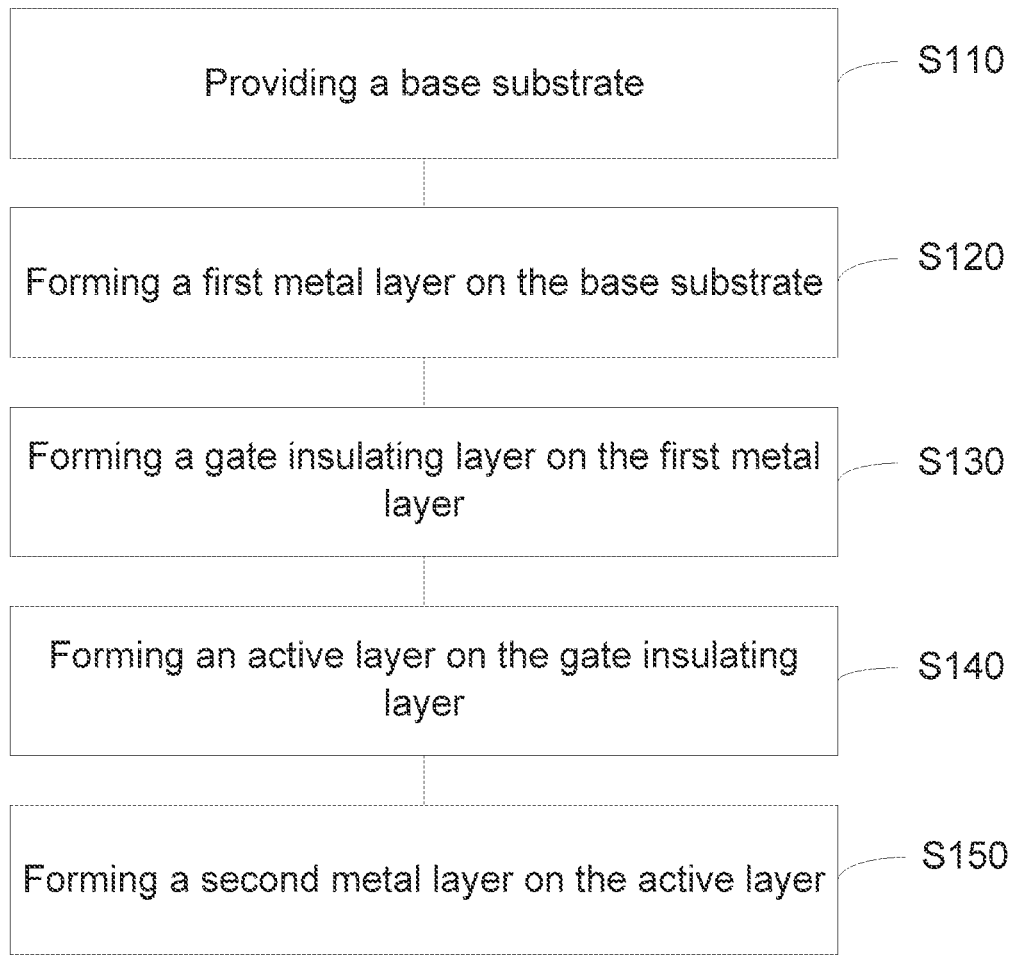
FIG. 1 is a flowchart of steps of a method of manufacturing an array substrate provided by an embodiment of the present invention.

Shown in FIG. 1 is a flowchart of a method of manufacturing an array substrate provided by an embodiment of the present invention, comprising following steps:

Step S110: providing a base substrate.

In the embodiment of the present invention, the base substrate is a glass substrate. The glass substrate mainly comprises alkali glass and alkali-free glass, and the alkali glass comprises soda glass and neutral borosilicate glass.

Step S120: forming a first metal layer on the base substrate.

In the embodiment of the present invention, the first metal layer mainly comprises gate traces. The gate traces are mainly sieve-like or spiral electrodes composed of metal filaments. A multi-pole electron tube formed by one or more electrodes disposed between an anode and a cathode has a sieve or spiral shape. The multi-pole electron tube is configured to control strength of an electric field on a surface of the cathode, thereby changing the cathode to emit electrons or capturing secondary emission electrons.

Step S130: forming a gate insulating layer on the first metal layer.

In the embodiment of the present invention, a chemical vapor deposition device is used to deposit the gate insulating layer on an upper surface of the first metal layer, and a deposition uses a dissociation reaction gas to form the gate insulating layer.

Step S140: forming an active layer on the gate insulating layer.

Figure 2:
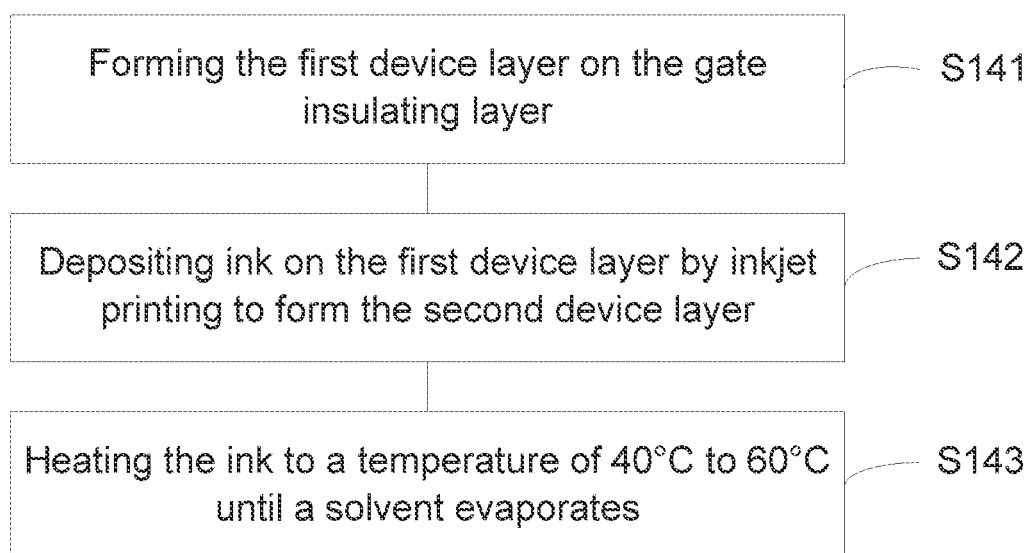
FIG. 2 is a flowchart of sub-steps of step S140 provided by the embodiment of the present invention.

With reference to FIG. 2, in the embodiment of the present invention, step S140 comprises following steps:

Step S141: forming the first device layer on the gate insulating layer.

In the embodiment of the present invention, a mobility of the first device layer is greater than a preset mobility, and the preset mobility ranges from 50 to 300 $cm^2V^{-1}s^{-1}$. When the mobility of the first device layer is greater than the preset mobility, it can be regarded as a device layer with high mobility. A material of the first device layer can be IGZO, Indium Tin Zinc Oxide (ITZO), etc.

Step S142: depositing ink on the first device layer by inkjet printing to form the second device layer.

In the embodiment of the present invention, the two-dimensional nanomaterial may comprise two-dimensional perovskite, two-dimensional molybdenum sulfide (MoS2), and two-dimensional inorganic compound (Mxene). For example, in the embodiment, a precursor of the ink formed by using the two-dimensional perovskite is Phenylethylammonium Iodide (PEAI): Methyl ammonium iodide (MAI): PbI2=2:2:3, and a solvent is N,N-Dimethylformamide (DMF). For another example, in other embodiments, the precursor of the ink formed by using the Mxene is MAX. A specific forming process can form MXene by etching a MAX phase. An etching solution usually contains fluoride ions, such as hydrofluoric acid (HF), ammonium hydrogen fluoride (NH4HF2), or a mixture of hydrochloric acid (HCl) and lithium fluoride (LiF). For example, etching Ti3AlC2 (MAX) in HF aqueous solution at a room temperature can selectively remove A atoms (Al), and a surface of a carbide layer produces terminal O, OH and/or F atoms. Since these atoms are all nanoparticles, called dispersion, they can be dispersed in DMF. For another example, in some other embodiments, the ink is formulated by the MoS2. Hydrogen sulfide gas is passed into the MoS2 solution to generate ammonium thiomolybdate, which is converted into molybdenum trisulfide precipitation by adding hydrochloric acid, and then centrifuged, washed, dried, crushed, and finally heated to 950° C. for desulfurization. Therefore, the two-dimensional nanomaterial is constructed as a photosensitive film, a composition of the nanomaterial is adjusted to construct a photoelectric film with high gain, then combined with the high mobility film layer, and a display device with high mobility and broad spectrum light response is constructed. Wherein, the photosensitive film layer and the photoelectric film layer are both the second device layer, and the high mobility film layer is the first device layer.

Step S143: heating the ink to a temperature of 40° C. to 60° C. until the solvent evaporates.

In the embodiment of the present invention, a material of the second device layer is the two-dimensional perovskite.

Step S150: forming a second metal layer on the active layer.

In the embodiment of the present invention, the second metal layer may be source and drain electrode layers.

Advantages of the present invention are that compared with the prior art, the present invention uses an inkjet printing method to construct the two-dimensional nanomaterial as the photosensitive film, and adjusts the composition of the nanomaterial to construct the photoelectric film with high gain, which is then combined with the high mobility film to construct the display device with high mobility and broad spectrum light response.

Figure 8:
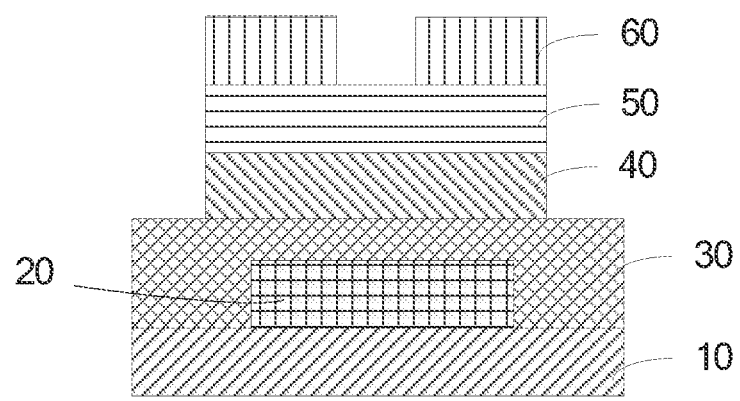
FIG. 8 is a schematic structural view of a second metal layer in the array substrate provided by the embodiment of the present invention.

Shown in FIG. 8 is a schematic structural view of the array substrate provided by the embodiment of the present invention. The array substrate comprises a base substrate 10, a first metal layer 20, a gate insulating layer 30, an active layer, and a second metal layer 60.

Figure 3:
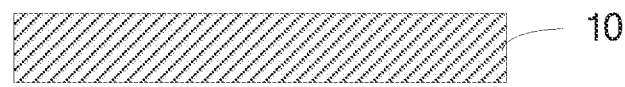
FIG. 3 is a schematic structural view of a base substrate in the array substrate provided by the embodiment of the present invention.

Referring to FIG. 3, in the embodiment of the present invention, the base substrate is a glass substrate. The glass substrate mainly comprises alkali glass and alkali-free glass, and the alkali glass comprises soda glass and neutral borosilicate glass.

Figure 4:
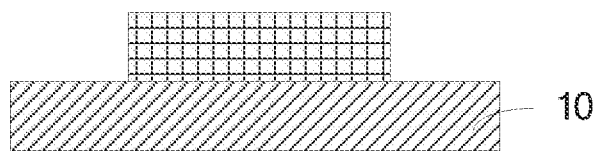
FIG. 4 is a schematic structural view of a first metal layer in the array substrate provided by the embodiment of the present invention.

Referring to FIG. 4, the first metal layer 20 is disposed on the base substrate 10. In the embodiment of the present invention, the first metal layer 20 mainly comprises the gate traces. The gate traces are mainly the sieve-like or spiral electrodes composed of the metal filaments. The multi-pole electron tube formed by one or more electrodes disposed between the anode and the cathode has the sieve or spiral shape. The multi-pole electron tube is configured to control the strength of the electric field on the surface of the cathode, thereby changing the cathode to emit the electrons or capturing the secondary emission electrons.

Figure 5:
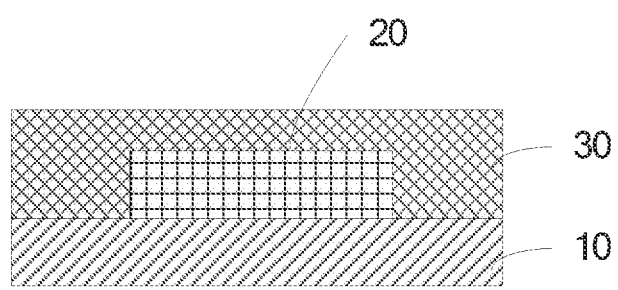
FIG. 5 is a schematic structural view of a gate insulating layer in the array substrate provided by the embodiment of the present invention.

Referring to FIG. 5, the gate insulating layer 30 is disposed on the first metal layer 20. In the embodiment of the present invention, the chemical vapor deposition device is used to deposit the gate insulating layer 30 on an upper surface of the first metal layer 20, and the deposition uses the dissociation reaction gas to form the gate insulating layer 30.

The active layer is disposed on the gate insulating layer 30. In the embodiment of the present invention, the active layer comprises a first device layer 40 and a second device layer 50.

Figure 6:
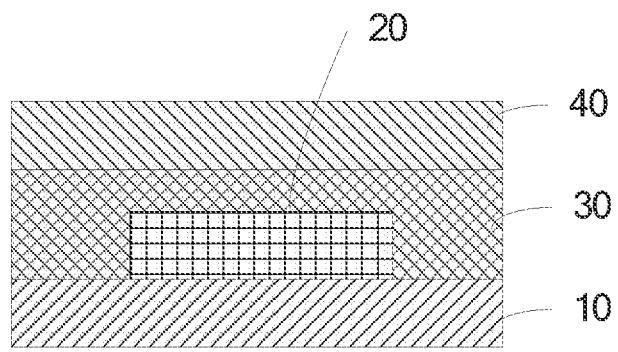
FIG. 6 is a schematic structural view of a first device layer in the array substrate provided by the embodiment of the present invention.

Referring to FIG. 6, the first device layer 40 is disposed on the gate insulating layer 30. In the embodiment of the present invention, a mobility of the first device layer 40 is greater than the preset mobility, and the preset mobility ranges from 50 to 300 $cm^2V^{-1}S^{-1}$. A material of the first device layer 40 can be IGZO, ITZO, etc.

Figure 7:
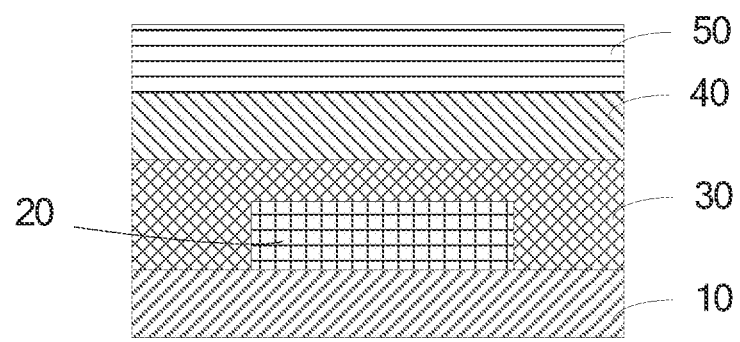
FIG. 7 is a schematic structural view of a second device layer in the array substrate provided by the embodiment of the present invention.

Referring to FIG. 7, the second device layer 50 is disposed on the first device layer 40. In the embodiment of the present invention, the two-dimensional nanomaterial may comprise two-dimensional perovskite, two-dimensional molybdenum sulfide (MoS2), and two-dimensional inorganic compound (Mxene). For example, in the embodiment, the precursor of the ink formed by using the two-dimensional perovskite is PEAI:MAI:PbI2=2:2:3, and the solvent is N,N-DMF. For another example, in other embodiments, the precursor of the ink formed by using the Mxene is MAX. The specific forming process can form MXene by etching the MAX phase. The etching solution usually contains fluoride ions, such as hydrofluoric acid (HF), ammonium hydrogen fluoride (NH4HF2), or the mixture of hydrochloric acid (HCl) and lithium fluoride (LiF). For example, etching Ti3AlC2 (MAX) in HF aqueous solution at the room temperature can selectively remove A atoms (Al), and the surface of the carbide layer produces terminal O, OH and/or F atoms. Since these atoms are all nanoparticles, called dispersion, they can be dispersed in DMF. For another example, in some other embodiments, the ink is formulated by the MoS2. Hydrogen sulfide gas is passed into the MoS2 solution to generate ammonium thiomolybdate, which is converted into molybdenum trisulfide precipitation by adding hydrochloric acid, and then centrifuged, washed, dried, crushed, and finally heated to 950° C. for desulfurization. Therefore, the two-dimensional nanomaterial is constructed as the photosensitive film, the composition of the nanomaterial is adjusted to construct the photoelectric film with high gain, then combined with the high mobility film layer, and the display device with high mobility and broad spectrum light response is constructed.

Continuing to refer to FIG. 8, the second metal layer 60 is disposed on the active layer. In the embodiment of the present invention, the second metal layer 60 is mainly the source and drain electrode layers.

The advantages of the present invention are that compared with the prior art, the present invention uses the inkjet printing method to construct the two-dimensional nanomaterial as the photosensitive film, and adjusts the composition of the nanomaterial to construct the photoelectric film with high gain, which is then combined with the high mobility film to construct the display device with high mobility and broad spectrum light response.

Figure 9:
FIG. 9 is a schematic structural view of a display panel provided by the embodiment of the present invention.

Shown in FIG. 9 is a schematic structural view of the display panel provided by the embodiment of the present invention. The display panel 300 comprises the array substrate described in the above embodiments. The display panel 300 can be used in a display device.

The display device can be any product or component with display function such as mobile phone, tablet, television, monitor, notebook, digital photo frame, navigator, etc.

When the display device of the embodiment adopts the array substrate described in the foregoing embodiments, its display effect is better.

Of course, the display device of the embodiment may also comprise other conventional structures, such as a power supply unit, a display drive unit, etc.

In the above-mentioned embodiments, the description of each embodiment has its own emphasis. For parts that are not described in detail in an embodiment, please refer to the relevant description of other embodiments.

In this article, specific examples are used to explain the principles and implementation of the present invention. The description of the above embodiments is only used to help understand the technical solutions and core ideas of the present invention. Those of ordinary skill in the art should understand that they can still modify the technical solutions described in the foregoing embodiments, or equivalently replace some of the technical features. However, these modifications or replacements do not cause the essence of the corresponding technical solutions to deviate from the scope of the technical solutions of the embodiments of the present invention.

What is claimed is:

1. A method of manufacturing an array substrate, comprising:
   providing a base substrate;
   forming a first metal layer on the base substrate;
   forming a gate insulating layer on the first metal layer;
   forming an active layer on the gate insulating layer; and
   forming a second metal layer on the active layer,
   wherein the active layer comprises a first device layer and a second device layer stacked in sequence, and the second device layer has a two-dimensional nanomaterial and a photosensitivity,
   wherein the forming of the active layer on the gate insulating layer comprises:
   forming the first device layer on the gate insulating layer, the first device layer having a mobility greater than a preset mobility ranging from 50 to 300 $cm^2V^{-1}s^{-1}$; and
   depositing ink on the first device layer by inkjet printing to form the second device layer,
   wherein a solute of the ink is Phenylethylammonium Iodide (PEAI): Methyl ammonium iodide (MAI): $PbI_2$=2:2:3.

2. The method of manufacturing the array substrate as claimed in claim 1, wherein a solvent of the ink is N,N-Dimethylformamide (DMF).

3. The method of manufacturing the array substrate as claimed in claim 1, further comprising:
   after the depositing of the ink on the first device layer by inkjet printing to form the second device layer, heating the ink to a temperature of 40° C. to 60° C. until a solvent evaporates.

4. The method of manufacturing the array substrate as claimed in claim 1, wherein the two-dimensional nanomaterial comprises: two-dimensional perovskite, two-dimensional molybdenum sulfide, a two-dimensional inorganic compound, or combinations thereof.

5. An array substrate, comprising:
a base substrate;
a first metal layer disposed on the base substrate;
a gate insulating layer disposed on the first metal layer;
an active layer disposed on the gate insulating layer; and
a second metal layer disposed on the active layer;
wherein the active layer comprises a first device layer and a second device layer stacked in sequence, and the second device layer has a two-dimensional nanomaterial and a photosensitivity;
the first device layer is disposed on the gate insulating layer, the first device layer has a mobility greater than a preset mobility ranging from 50 to 300 $cm^2V^{-1}s^{-1}$; and
a precursor of the two-dimensional nanomaterial comprises Phenylethylammonium Iodide (PEAI), Methyl ammonium iodide (MAI), and $PbI_2$, and a ratio of PEAI, MAI, and $PbI_2$ is 2:2:3.

6. The array substrate as claimed in claim 5, wherein the two-dimensional nanomaterial comprises: two-dimensional perovskite, two-dimensional molybdenum sulfide, a two-dimensional inorganic compound, or combinations thereof.

7. A display panel, comprising the array substrate as claimed in claim 5.

* * * * *